(12) United States Patent
Abdel-Rahman et al.

(10) Patent No.: US 10,481,006 B1
(45) Date of Patent: Nov. 19, 2019

(54) THERMAL SENSING LAYER FOR MICROBOLOMETER AND METHOD OF MAKING THE SAME

(71) Applicant: KING SAUD UNIVERSITY, Riyadh (SA)

(72) Inventors: Mohamed Ramy Abdel-Rahman, Riyadh (SA); Mohammad Abdulaziz Alduraibi, Riyadh (SA); Bouraoui Ilahi, Riyadh (SA)

(73) Assignee: King Saud University, Riyadh (SA)

( * ) Notice: Subject to any disclaimer, the term of this patent is extended or adjusted under 35 U.S.C. 154(b) by 0 days.

(21) Appl. No.: 16/262,454

(22) Filed: Jan. 30, 2019

(51) Int. Cl.
*H01L 21/02* (2006.01)
*G01J 5/02* (2006.01)
(Continued)

(52) U.S. Cl.
CPC ............... *G01J 5/024* (2013.01); *G01J 5/023* (2013.01); *G01J 5/0853* (2013.01);
(Continued)

(58) Field of Classification Search
CPC ....... G01J 5/024; H01L 31/0328; H01L 31/20
(Continued)

(56) References Cited

U.S. PATENT DOCUMENTS

| 7,795,605 B2 | 9/2010 | Habib et al. |
| 8,213,254 B2 | 7/2012 | Choi et al. |
| (Continued) | | |

FOREIGN PATENT DOCUMENTS

| JP | 5798827 A | 6/1982 |
| JP | 61128131 A | 6/1986 |
| (Continued) | | |

OTHER PUBLICATIONS

Morea et al. "Optimization of TCR and heat transport in group-IV multiple-quantum-well microbolometers." Infrared Sensors, Devices, and Applications VI. vol. 9974. International Society for Optics and Photonics, 2016.
(Continued)

*Primary Examiner* — Tan N Tran
(74) *Attorney, Agent, or Firm* — Richard C. Litman; Nath, Goldberg & Meyer (57) ABSTRACT

The thermal sensing layer for a microbolometer includes a $Ge_{1-x}Sn_x$ film layer, where $0.17 \leq x \leq 0.25$. The $Ge_{1-x}Sn_x$ film layer may be deposited on a substrate layer, such as pure silicon. An additional layer of silicon dioxide may be added, such that the silicon dioxide layer is sandwiched between the silicon substrate and the $Ge_{1-x}Sn_x$ film, In order to make the $Ge_{1-x}Sn_x$ thin film layer, germanium (Ge) and tin (Sn) are simultaneously sputter deposited on the substrate, where the atomic ratio of germanium to tin is between 0.83:0.17 and 0.75:0.25 inclusive. The sputter deposition may occur in an argon atmosphere, with the germanium having a deposition rate of 9.776 nm/min, and with the tin having a deposition rate between 2.885 nm/min and 4.579 nm/min.

6 Claims, 7 Drawing Sheets

(51) Int. Cl.
  *G01J 5/08* (2006.01)
  *H01L 31/0328* (2006.01)
  *H01L 31/20* (2006.01)
  *G01J 5/10* (2006.01)

(52) U.S. Cl.
  CPC .......... *H01L 31/0328* (2013.01); *H01L 31/20* (2013.01); *G01J 2005/103* (2013.01)

(58) Field of Classification Search
  USPC .................. 257/226, 232, 234, 467, 616
  See application file for complete search history.

(56) References Cited

U.S. PATENT DOCUMENTS

| | | | |
|---|---|---|---|
| 9,728,252 | B2 | 8/2017 | Lee et al. |
| 10,337,927 | B1 * | 7/2019 | Rana .................. G01J 5/0853 |

FOREIGN PATENT DOCUMENTS

| | | |
|---|---|---|
| JP | 62291001 A | 12/1987 |
| JP | 2003239063 A | 8/2003 |
| JP | 2018129969 A | 8/2018 |

OTHER PUBLICATIONS

Mahmodi et al. "Formation of nanocrystalline GeSn thin film on Si substrate by sputtering and rapid thermal annealing." Superlattices and Microstructures 98 (2016): 235-241.

* cited by examiner

THERMAL SENSING LAYER FOR MICROBOLOMETER AND METHOD OF MAKING THE SAME

BACKGROUND

1. Field

The disclosure of the present patent application relates to the manufacture of infrared detecting materials, and particularly to a germanium-tin (Ge-Sn) thin film for use in the manufacture of microbolometers.

2. Description of the Related Art

A microbolometer is a specific type of bolometer which is typically used as a detector in a thermal camera. Infrared radiation with wavelengths between 7.5-14 μm strikes the detector material, heating it, and thus changing its electrical resistance. This resistance change is measured and processed into electronic signals representing scene apparent temperatures which can be used to create an image.

The two most commonly used infrared (IR) radiation detecting materials in microbolometers are amorphous silicon (a-Si) and vanadium oxide (VO). Amorphous silicon works well because it can easily be integrated into a complementary metal-oxide-semiconductor (CMOS) fabrication process, is highly stable, has a fast time constant, and has a long mean time before failure. To create the layered structure and patterning, the CMOS fabrication process can be used, but it requires temperatures to stay below 200° C.

Vanadium oxide thin films may also be integrated into the CMOS fabrication process, although not as easily as a-Si, due to temperature restrictions. $VO_2$ has low resistance but undergoes a metal-insulator phase change near 67° C. and also has a lower value of temperature coefficient of resistance (TCR), On the other hand, $V_2O_5$ exhibits high resistance and also high TCR. Many phases of $VO_x$ exist, although it appears that x≈1.8 has become the most popular for microbolometer applications. The search for semiconductors materials which are more common, and thus easier to experiment with, is ongoing.

The resistivity and the TCR of the temperature sensing layer are two main properties that influence microbolometer performance. The thin film forming the temperature sensing layer should possess a resistivity that is compatible with the accompanying read-out integrated circuit (ROIC). The resistivity value of the temperature sensing layer also has a direct effect on the electrical noise of the microbolometer. In addition, the responsivity of a microbolometer is directly proportional to the TCR of the temperature sensing layer. A temperature sensing layer with a high TCR is desirable.

The group IV $Ge_{1-x}Sn_x$ alloys have recently emerged as a promising CMOS compatible semiconductor material, and are being investigated for many photonic and microelectronic applications, $Ge_{1-x}Sn_x$ compound semiconductors have been proven to have a direct band gap and have been applied to making light emitting diodes, laser diodes, p-i-n photodetectors, photoconductors, p-MOSFETs and other devices. It would be desirable to be able to extend group IV $Ge_{1-x}Sn_x$ alloys to the manufacture of thermal sensing layers in uncooled microbolometers.

The reduction of the $Ge_{1-x}Sn_x$ alloy's band gap energy below that of germanium (Ge) alone would result in different resistivity and TCR properties when compared to just Ge. Thus, a thin film for a microbolometer and a method of making the same solving the aforementioned problems is desired.

SUMMARY

A thermal sensing layer for a microbolometer includes an amorphous $Ge_{1-x}Sn_x$ film layer, where 0.17≤x≤0.25. The $Ge_{1-x}Sn_x$ film layer may be deposited on a substrate layer, such as pure silicon. An additional layer of silicon dioxide may be added, such that the silicon dioxide layer is sandwiched between the silicon substrate and the $Ge_{1-x}Sn_x$ film.

In order to make the $Ge_{1-x}Sn_x$ thin film layer, germanium (Ge) and tin (Sn) are simultaneously sputter deposited on the substrate, where the atomic ratio of germanium to tin is between 0.83:0.17 and 0.75:0.25 inclusive. The sputter deposition may occur in an argon atmosphere, with the germanium having a deposition rate of 9.776 nm/min, and with the tin having a deposition rate between 2.885 nm/min and 4.579 nm/min.

These and other features of the present invention will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
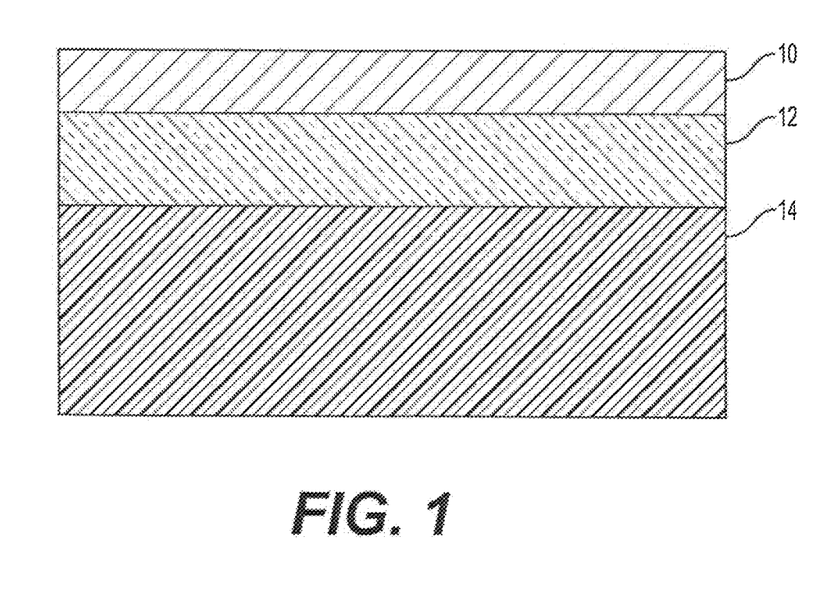
FIG. 1 is a side view in section of a thermal sensing layer for a microbolometer.

A thermal sensing layer for a microbolometer includes a semi-conducting thin film layer including amorphous germanium tin (GeSn). The thin film layer can have a thickness of about 200 nm. The GeSn alloy can be $Ge_{1-x}Sn_x$, where 0.17≤x≤0.25. As shown in FIG. 1, the $Ge_{1-x}Sn_x$ film layer 10 may be deposited on a substrate layer 14, such as pure silicon. An additional layer of silicon dioxide 12 may he added, such that the silicon dioxide layer 12 is sandwiched between the silicon layer 14 and the $Ge_{1-x}Sn_x$ film 10. As a non-limiting example, the $Ge_{1-x}Sn_x$ film layer 10 may have a thickness of approximately 200 nm, the silicon dioxide ($SiO_2$) layer 12 may have a thickness of approximately 300 nm, and the silicon (Si) layer 14 may have a thickness of approximately 385 μm.

In order to make the $Ge_{1-x}Sn_x$ thin film layer, germanium (Ge) and tin (Sn) are simultaneously sputter deposited on the substrate, where the atomic ratio of germanium to tin is between 0.83:0.17 and 0.75:0.25 inclusive. The sputter deposition may occur in an argon atmosphere, with the germanium having a deposition rate of 9.776 nm/min, and with the tin having a deposition rate between 2.885 nm/min and 4.579 nm/min.

In experiments, $Ge_{1-x}Sn_x$ thin films were deposited on silicon substrates topped with 300 nm of thermally grown silicon dioxide ($SiO_2$), which is provided as electrical insulation. The thickness of each deposited $Ge_{1-x}Sn_x$ thin film was targeted to be 200 nm. The $Ge_{1-x}Sn_x$ thin films were synthesized by simultaneous sputter deposition from a 99.999% pure Ge target and a 99.99% pure Sn target. All depositions were made at room temperature at an argon pressure of 5 mTorr and at a chamber base pressure of $1.8 \times 10^{-6}$ Torr. Germanium was sputter deposited using 280 W of RF power at a deposition rate of 9.776 nm/min. Tin was sputter deposited at three different DC powers: 10 W, 15 W and 20 W, respectively corresponding to deposition rates of 2.885, 3,932 and 4.579 nm/min. In this manner, three different $Ge_{1-x}Sn_x$ thin films samples were prepared, each having a different Sn concentration. In addition, one reference Ge thin film sample, having a thickness of 200 nm, was also prepared.

Figure 2:
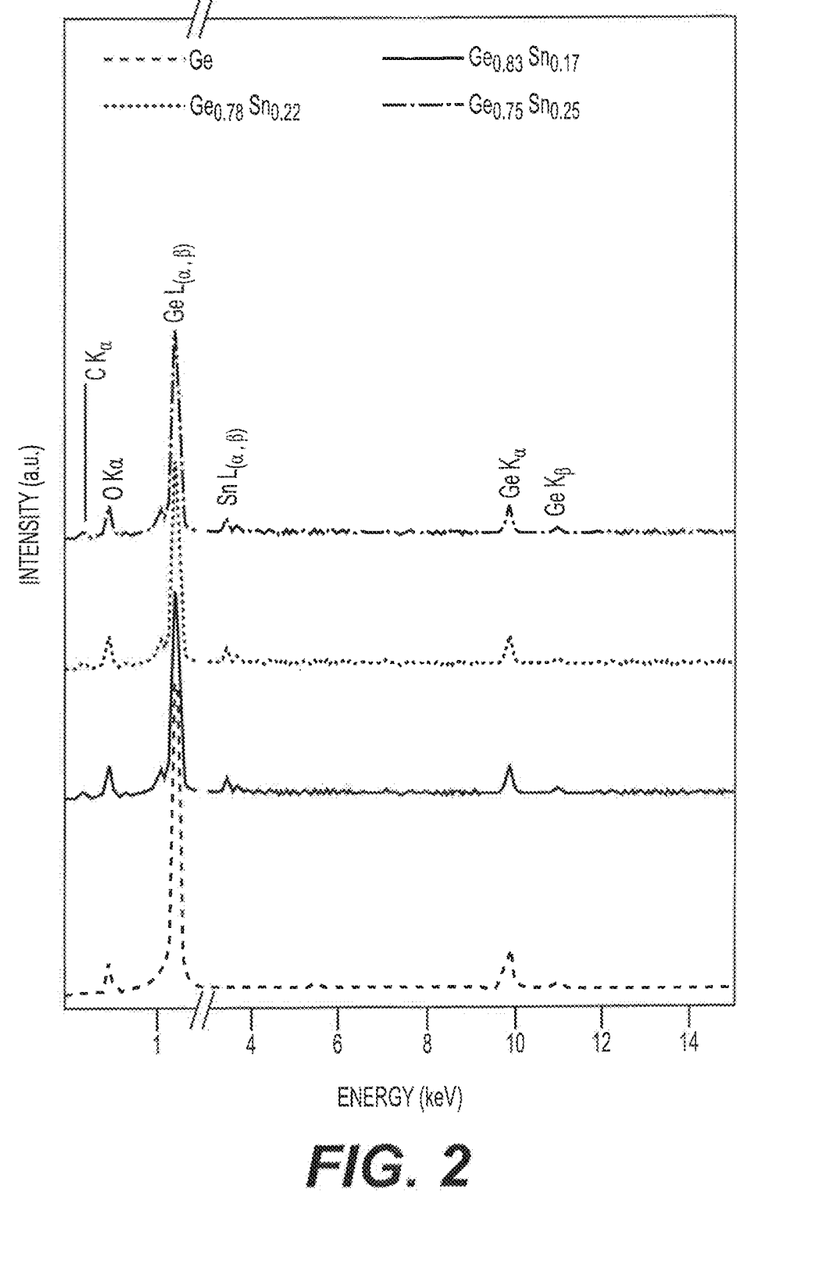
FIG. 2 is a graph showing electron dispersive X-ray (EDX) spectroscopy results for samples of the thin film layer with differing germanium to tin ratios, and for a control sample of pure germanium.

Electron dispersive X-ray (EDX) spectroscopy was used to determine the elemental composition of the Ge and $Ge_{1-x}Sn_x$ thin films. The measured EDX spectra for the synthesized thin films are shown in FIG. 2. The measured spectra show the presence of Ge $L_\alpha$, Ge $L_\beta$, Ge $K_\alpha$, and Ge $K_\beta$ peaks, in addition to Sn $L_\alpha$ and Sn $L_\beta$ peaks. The Sn $L_\alpha$ and Sn $L_\beta$ peaks were absent, as expected, in the Ge thin film. All measured spectra showed (O) $K_\alpha$ peaks, which are due to the underlying $SiO_2$ layer. The spectra also showed the typical artificial weak (C) $K_\alpha$ peaks. It should be noted that the EDX spectra shown are intentionally broken to hide the Si peak due its high intensity, ensuring display clarity for the Ge and Sn peaks. Further, the EDX analysis revealed Sn atomic concentrations of 17%, 22%, and 25% in the $Ge_{1-x}Sn_x$ thin films prepared at Sn deposition rates of 2.885, 3.932, and 4.579 nm/min, respectively, Additionally, the Sn atomic concentration was measured to be 0% in the Ge reference sample.

Figure 6A:
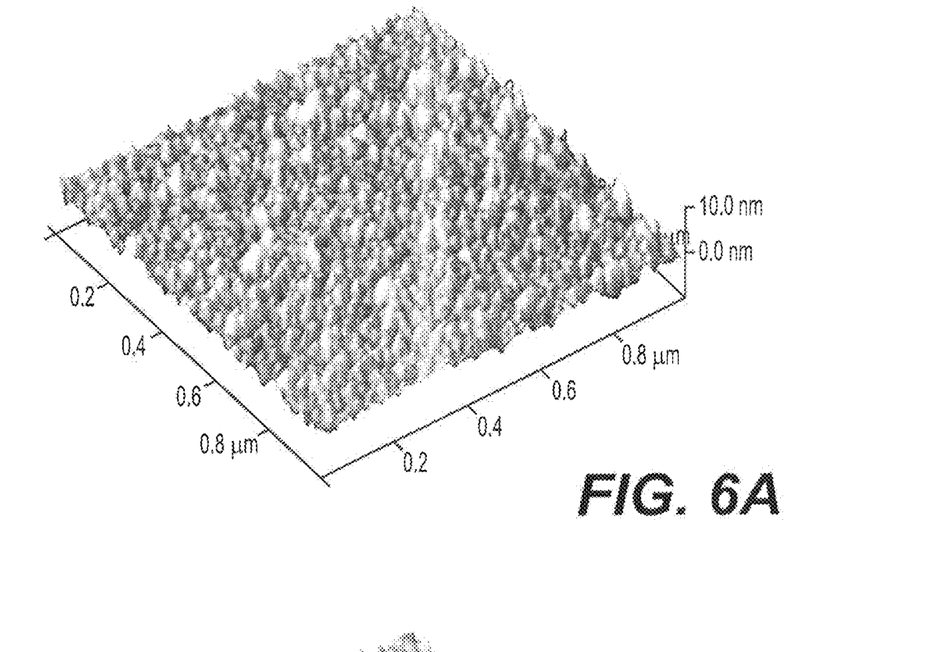
FIG. 6A is an atomic force micrograph of a control sample of pure germanium.
Figure 6B:
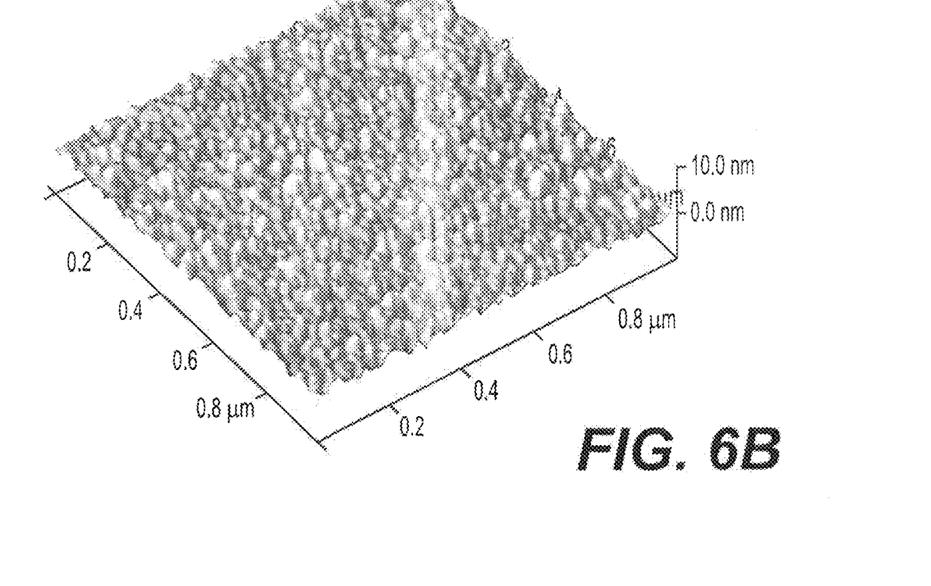
FIG. 6B is an atomic force micrograph of a sample of the thin film for a microbolometer with an atomic ratio of germanium to tin of 0.83:0.17.
Figure 6C:
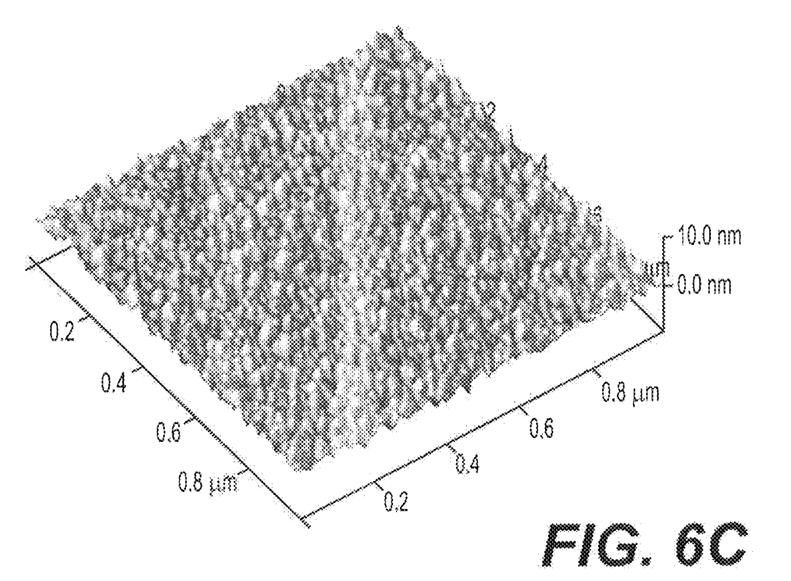
FIG. 6C is an atomic force micrograph of a sample of the thin film for a microbolometer with an atomic ratio of germanium to tin of 0.78:0.22.
Figure 6D:
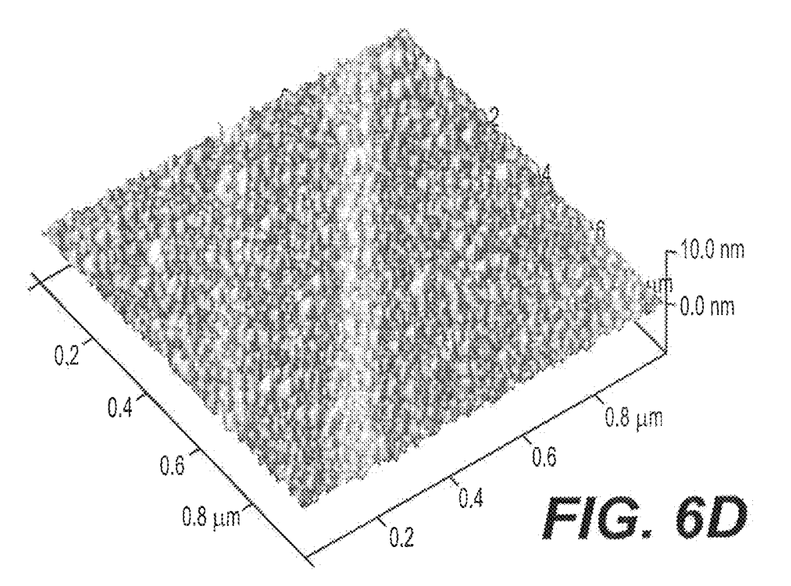
FIG. 6D is an atomic force micrograph of a sample of the thin film for a microbolometer with an atomic ratio of germanium to tin of 0.75:0.25.

Atomic force microscopy (AFM) analysis was also performed to examine the surface morphology of the prepared Ge and $Ge_{1-x}Sn_x$ thin films. In general, a low surface roughness is desirable, as it leads to suppressing surface effects, such as dangling bonds at material interfaces which result in lower flicker noise. AFM measurements were made in 1 μm×1 μm scanning areas. The measured rms surface roughnesses, $R_q$, were 0.56 nm, 0.55 nm, 0.465 nm, and 0.327 for the Ge (shown in FIG. 6A), $Ge_{0.83}Sn_{0.17}$ (shown in FIG. 6B), $Ge_{0.78}Sn_{0.22}$ (shown in FIG. 6C), and $Ge_{0.75}Sn_{0.25}$ (shown in FIG. 6D) samples, respectively. The average surface roughnesses, $R_a$, were measured to be 0.755 nm, 0.435 nm, 0.369 nm, and 0.257 nm for the Ge, $Ge_{0.83}Sn_{0.17}$, $Ge_{0.78}Sn_{0.22}$, and $Ge_{0.75}Sn_{0.25}$ samples, respectively. It was observed that the decrease in Ge concentration causes a decrease in surface roughness. In general, the measured surface roughnesses of the studied samples are considered to be low and would qualify the thin films to be used in making thermometer layers in microbolometers.

Sheet resistance versus temperature measurements were performed in order to evaluate the thermal sensing properties of the synthesized Ge and $Ge_{1-x}Sn_x$ alloy thin films. The thin film samples were placed on a hot plate, which allowed the temperature to be varied from 293 K to 345 K in 2 K steps, The sheet resistance was measured using a four-point probe tool. The sheet resistance versus temperature measurements for the $Ge_{1-x}Sn_x$ thin films and the Ge reference thin film sample are plotted in FIGS. 3 and 4, respectively. The measured sheet resistances of the $Ge_{1-x}Sn_x$ thin films were found to be inversely proportional to the thin films' temperature, indicating the existence of a semiconducting behavior in all samples. The plotted sheet resistance versus temperature curves were fitted with an exponential decay fit function, confirming that the semiconducting behavior of the thin films follows the Arrhenius relationship: $R(T)=R_0 e^{-\Delta E/\kappa T}$, where R and T are the resistance and temperature of the semiconducting material, respectively, $R_0$ is a constant, $\Delta E$ is the activation energy, and κ is Boltzmann's constant.

Figure 3:
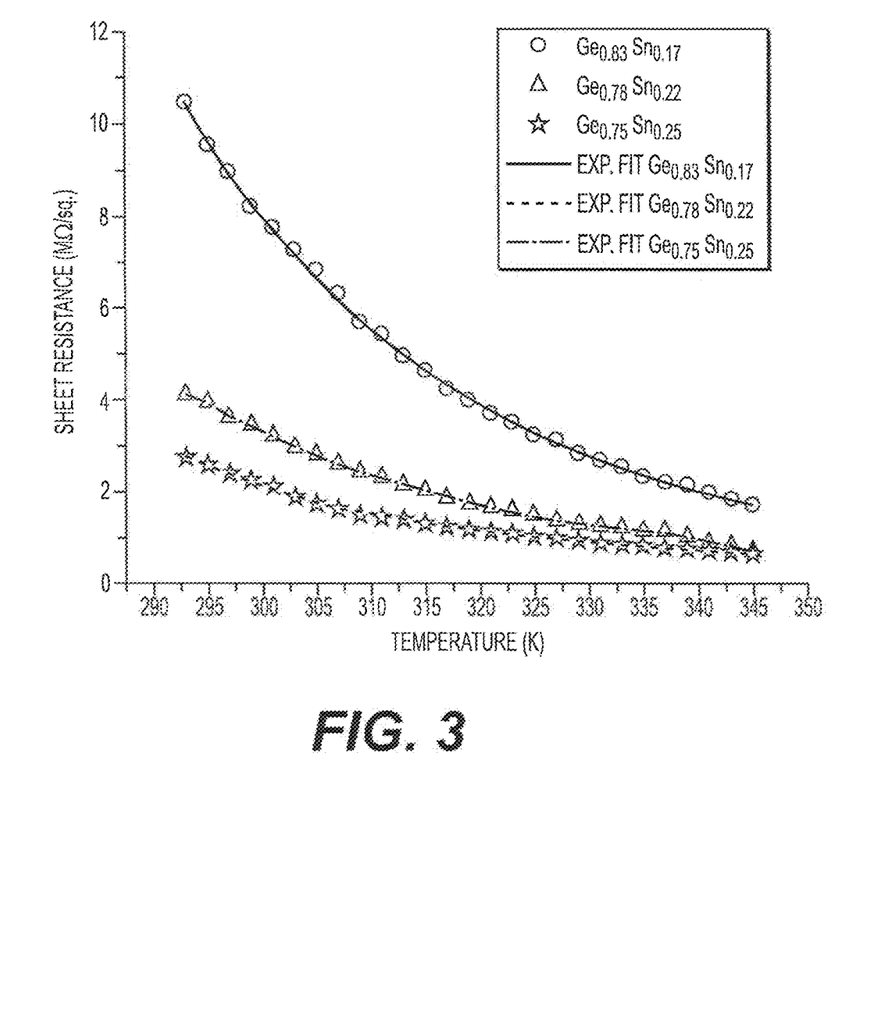
FIG. 3 is a plot of sheet resistance as a function of temperature for the samples of the thin film layer with differing germanium to tin ratios.
Figure 4:
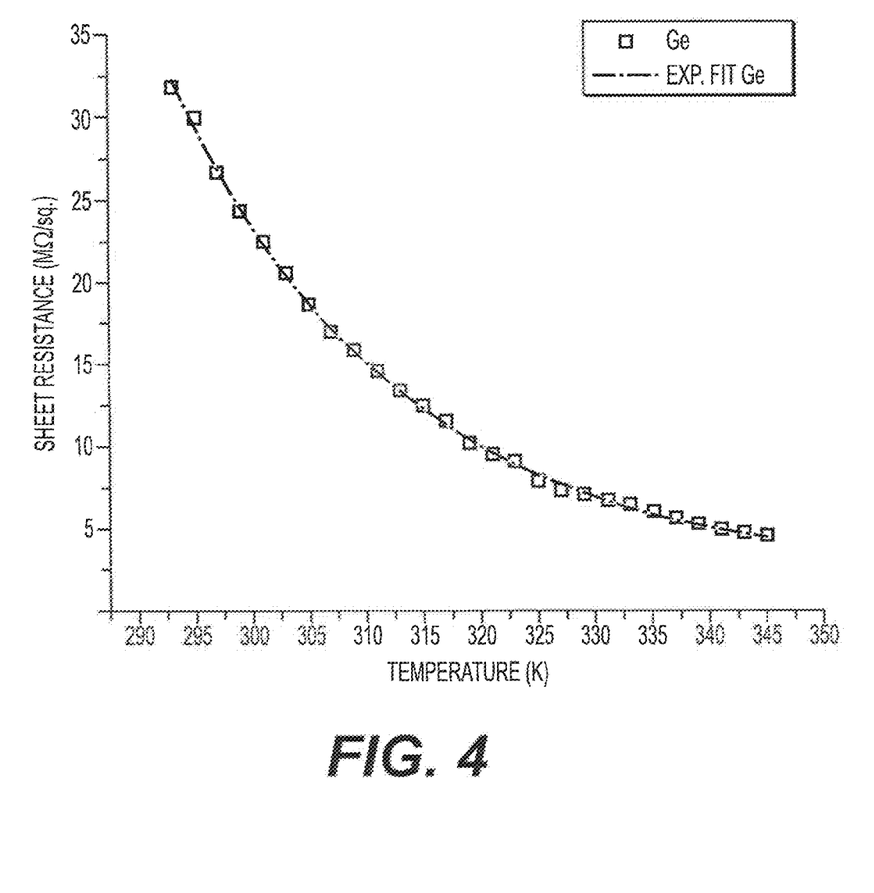
FIG. 4 is a plot of sheet resistance as a function of temperature for the control sample of pure germanium.

It can be seen that the $Ge_{1-x}Sn_x$ alloy's sheet resistance values decrease as the Sn concentration increases, which can be attributed to the increase in the metallic Sn content in the thin film. Room temperature (299 K) sheet resistance values varied from 24.36, 8.23, 3.457, and 2.273 MΩ/sq for the Ge, $Ge_{0.83}Sn_{0.17}$, $Ge_{0.78}Sn_{0.22}$, and $Ge_{0.75}Sn_{0.25}$ samples, respectively. This corresponds to room temperature resistivities of 487.2, 164.6, 69.14 and 45.46 Ω·cm for the Ge, $Ge_{0.83}Sn_{0.17}$, $Ge_{0.78}Sn_{0.22}$, and $Ge_{0.75}Sn_{0.25}$ samples, respectively. Further, the activation energies were extracted from the measured resistance versus temperature data, where they represent the slopes of the Arrhenius plots of ln(R). versus 1/κT curves. The extracted activation energies $\Delta E$ were found to be 0.342 eV, 0.312 eV, 0.28 eV and 0.253 eV for the Ge, $Ge_{0.83}Sn_{0.17}$, $Ge_{0.78}Sn_{0.22}$, and $Ge_{0.75}Sn_{0.25}$ samples, respectively. The TCRs were then calculated as $$TCR = \frac{1}{R} \cdot \frac{dR}{dT} = -\frac{\Delta E}{kT^2}.$$

Figure 5:
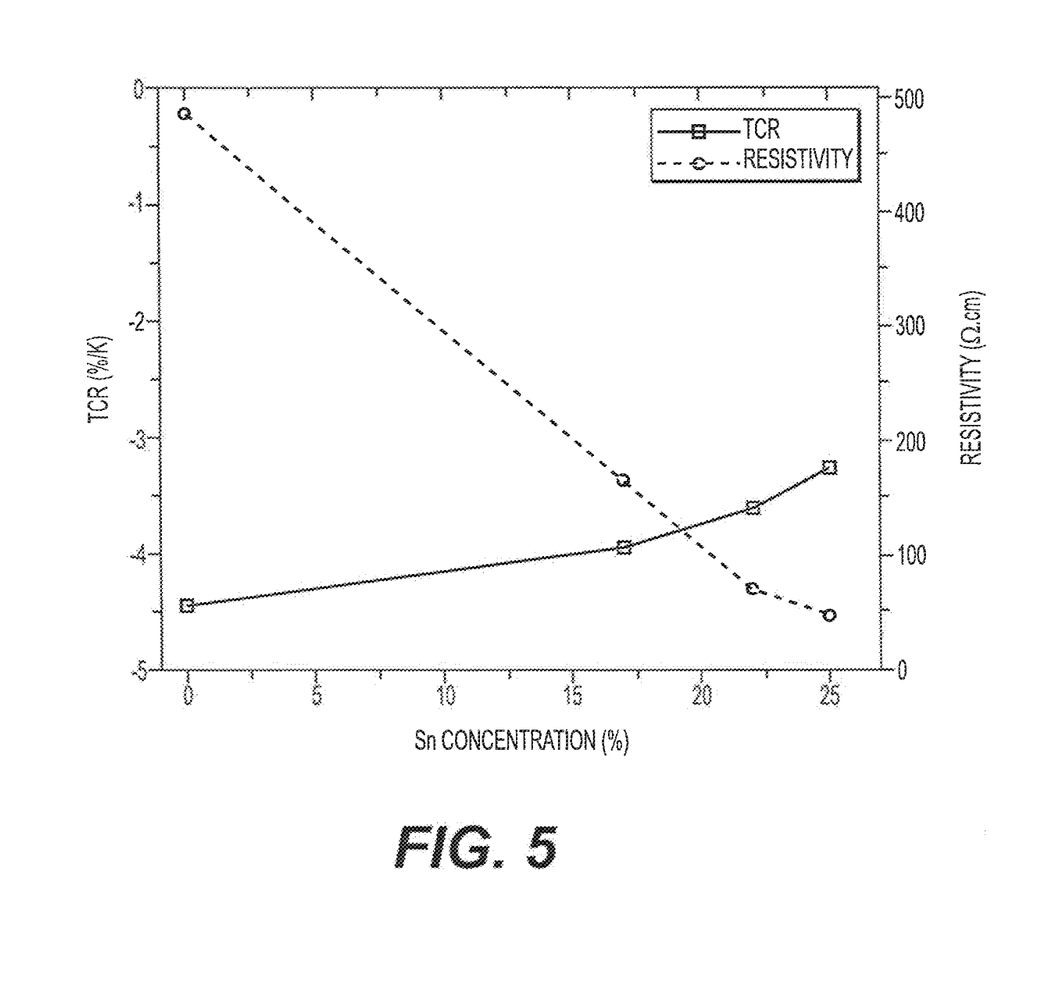
FIG. 5 is a plot showing temperature coefficient of resistance (TCR) and resistivity as a function of tin concentration for the samples of the thin film layer with differing germanium to tin ratios, and for the control sample of pure germanium.

Accordingly, the room temperature TCRs were found to be −4.45, −3.96, −3.63 and −3.79%/K for the Ge, $Ge_{0.83}Sn_{0.17}$, $GE_{0.78}Sn_{0.22}$, and $Ge_{0.75}Sn_{0.25}$ samples, respectively. The room temperature TCRs were found to decrease as the Sn content in the thin film increases. FIG. 5 depicts the calculated TCR and the measured resistivity versus Sn concentration in the $Ge_{1-x}Sn_x$ alloy thin films.

It is to be understood that the thin film for a microbolometer and method of making the same is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A thermal sensing layer for a microbolometer, comprising a thin film of amorphous $Ge_{1-x}Sn_x$, wherein 0.17≤x≤0.25.

2. The thermal sensing layer for a microbolometer as recited in claim 1, further comprising a pure silicon substrate layer, wherein said $Ge_{1-x}Sn_x$ film is deposited on said substrate layer.

3. The thermal sensing layer for a microbolometer as recited in claim 2, further comprising a silicon dioxide layer, the silicon dioxide layer being sandwiched between the silicon layer and the $GE_{1-x}Sn_x$ film.

4. The thermal sensing layer for a microbolometer as recited in claim 1, wherein the $Ge_{1-x}Sn_x$ film comprises $Ge_{0.83}Sn_{0.17}$.

5. The thermal sensing layer for a microbolometer as recited in claim 1, wherein the $Ge_{1-x}Sn_x$ film comprises $Ge_{0.78}Sn_{0.22}$.

6. The thermal sensing layer for a microbolometer as recited in claim 1, wherein the $Ge_{1-x}Sn_x$ film comprises $Ge_{0.75}Sn_{0.25}$.

\* \* \* \* \*